(12) United States Patent
Pihl (10) Patent No.: US 11,817,799 B2
(45) Date of Patent: Nov. 14, 2023

(54) SINGLE CRYSTAL ULTRASONIC TRANSDUCER WITH CHARGE MODE RECEIVER

(71) Applicant: Halliburton Energy Services, Inc., Houston, TX (US)

(72) Inventor: Joachim Alexander Pihl, Sandefjord (NO)

(73) Assignee: Halliburton Energy Services, Inc., Houston, TX (US)

( * ) Notice: Subject to any disclaimer, the term of this patent is extended or adjusted under 35 U.S.C. 154(b) by 274 days.

(21) Appl. No.: 16/953,472

(22) Filed: Nov. 20, 2020

(65) Prior Publication Data

US 2022/0166348 A1    May 26, 2022

(51) Int. Cl.
| | | |
|---|---|---|
| *E21B 47/16* | (2006.01) | |
| *H04R 17/00* | (2006.01) | |
| *B06B 1/06* | (2006.01) | |
| *H02N 2/00* | (2006.01) | |
| *H10N 30/853* | (2023.01) | |

(52) U.S. Cl.
CPC ........... *H02N 2/0075* (2013.01); *E21B 47/16* (2013.01); *H04R 17/00* (2013.01); *H10N 30/853* (2023.02); *B06B 1/0644* (2013.01)

(58) Field of Classification Search
None
See application file for complete search history.

(56) References Cited

U.S. PATENT DOCUMENTS

| | | | | |
|---|---|---|---|---|
| 4,388,710 A | * | 6/1983 | Pecon, Jr. ............... | G08C 23/02 367/134 |
| 5,744,898 A | * | 4/1998 | Smith .................... | B06B 1/064 600/459 |
| 6,442,105 B1 | * | 8/2002 | Tubel .................... | E21B 43/12 340/854.3 |
| 9,797,241 B2 | | 10/2017 | McRory | |
| 2009/0273256 A1 | | 11/2009 | Martin et al. | |
| 2014/0177388 A1 | * | 6/2014 | D'Angelo ............. | E21B 47/107 367/35 |
| 2014/0244175 A1 | | 8/2014 | Donderici et al. | |
| 2016/0265349 A1 | * | 9/2016 | Saulnier ................. | E21B 47/16 |
| 2017/0335681 A1 | * | 11/2017 | Nguyen ................. | E21B 47/16 |
| 2018/0328120 A1 | | 11/2018 | Therrien et al. | |
| 2020/0391247 A1 | * | 12/2020 | Jin .......................... | G01V 1/52 |

OTHER PUBLICATIONS

Keim, Understanding and Implementing Charge Amplifiers for Piezoelectric Sensor Systems., Oct. 22, 2018 (Year: 2018).*

(Continued)

*Primary Examiner* — Curtis A Kuntz
*Assistant Examiner* — Jerold B Murphy
(74) *Attorney, Agent, or Firm* — DELIZIO, PEACOCK, LEWIN & GUERRA (57) ABSTRACT

Apparatus, systems, and methods for acoustic transmission via tubular are provided. A transceiver comprises a piezoelectric transducer; a switch coupled to the piezoelectric transducer; a charge mode receiver coupled to the switch; and a transmitter coupled to the switch.

19 Claims, 8 Drawing Sheets

(56) References Cited

OTHER PUBLICATIONS

Keim, "Understanding and Implementing Charge Amplifiers for Piezoelectric Sensor Systems", All About Circuits [retrieved on Nov. 20, 2020] retrieved from the internet <URL: https://www.allaboutcircuits.com/technical-articles/understanding-and-implementing-charge-amplifiers-for-piezoelectric-sensor-s/ >, Oct. 22, 2018, 5 pages.
Savage, "Ultrasound & Piezoelectric Physics for Engineers: A Primer with Applications and Examples 2nd Edition", Chapter 6, p. 125-126.
"PCT Application No. PCT/US2021/071480, International Search Report and Written Opinion", dated Feb. 4, 2022, 9 pages.

\* cited by examiner

SINGLE CRYSTAL ULTRASONIC TRANSDUCER WITH CHARGE MODE RECEIVER

BACKGROUND

The disclosure generally relates to acoustic telemetry for communications in downhole well systems.

In downhole well systems there is the need to communicate between downhole devices and the surface. While this communication often is performed with one or more wires, at times this is not possible due to the use case or cost. In such instances, wireless communication can be used. One method of wireless communication includes sending an acoustic signal via one or more tubulars. Such acoustic systems typically require a lot of downhole power to be supplied to downhole transmitters. Further, such acoustic systems use a different transducer type for receiving an acoustic signal from that of transmitting a signal.

BRIEF DESCRIPTION OF THE DRAWINGS

One or more embodiments of the disclosure may be better understood by referencing the accompanying drawings.

DESCRIPTION

The description that follows includes example systems, methods, techniques, and program flows that embody embodiments of the disclosure. However, it is understood that this disclosure may be practiced without these specific details. In other instances, well-known instructions, protocols, structures, and techniques have not been shown in detail in order not to obfuscate the description.

It is beneficial in a downhole telemetry system to reduce cost and lower power consumption of the system. As such, it is desirous to minimize the components used and reduce the power required for each of those components. As discussed herein, one way to reduce components is to use a single piezoelectric transducer for both receiving and transmitting an acoustic signal through a tubular. Other systems for acoustic telemetry use two different types of transducers—one for receiving and one for transmitting—as there are perceived tradeoffs between having sufficient sensitivity on the receiving side and sufficient power/voltage on the transmit side. Others have tried using step-up transformers and/or step-up power supplies to couple the transducers with batteries, but this adds more components and still requires the same (or more) power.

By utilizing electronic switching and a charge mode receiver, a sensitive receiver can be combined with a low voltage transmitter with few components and no transformers. This results in a low power system, having lower cost (e.g., from requiring fewer components and/or batteries). Using fewer components also facilitates a more compact design, as less components are required.

Figure 1:
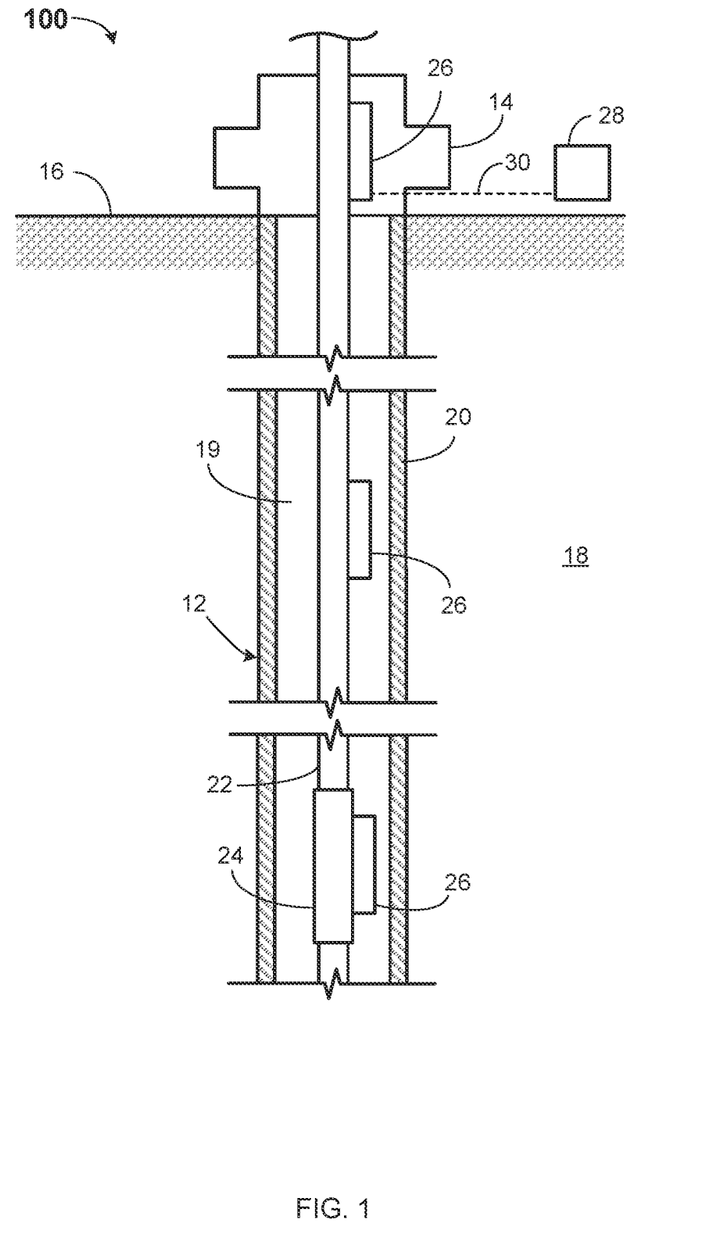
FIG. 1 depicts a schematic partially cross-sectional view of a well system, according to one or more embodiments.

FIG. 1 depicts a schematic partially cross-sectional view of a well system 100, according to one or more embodiments. The well system 100 includes a substantially cylindrical wellbore 12 extending from a wellhead 14 at the surface 16 downward into the Earth into a subterranean formation 18 (one zone is shown). The wellbore 12 extending from the wellhead 14 to the subterranean formation 18 is lined with lengths of tubing, called casing 20, to form a tubular located in the wellbore 12 and extending the length of the wellbore 12 or at least a portion thereof. Although not shown, a portion of the wellbore 12 can remain uncased, i.e. not having casing. Although one casing 20 is shown, the well system 100 may have multiple layers of casing radially disposed about casing 20. A well string 22 is shown as having been lowered from the surface 16 into the wellbore 12. The well string 22 is a series of jointed lengths of tubing coupled together end-to-end and/or a continuous (i.e., not jointed) coiled tubing (either referred to as a "tubular"), and can include one or more well tools 24 (one shown). The depicted well system 100 is a vertical well, with the wellbore 12 extending substantially vertically from the surface 16 to the subterranean formation 18. The concepts herein, however, are applicable to many other different configurations of wells, including horizontal, slanted or otherwise deviated wells, and multilateral wells with legs deviating from an entry well.

The well system 100 is also shown having a well telemetry system for sending and receiving telemetric communication signals via a tubular (e.g., the well string 22 or casing 20). In one or more embodiments, the signals are encoded as acoustic waves carried on the tubular as vibrations in the materials of the tubular components. The well telemetry system includes a plurality of transceivers 26 (three shown, but can include one, two, or four or more) and a surface telemetry station 28. The plurality of transceivers 26 are acoustically coupled to a tubular, e.g., the well string 22 (as shown), the one or more well tools 24, the casing 20, or another downhole tubular. At least one transceiver 26 (e.g., an uppermost transceiver) can be located at or near the surface 16. In one or more embodiments, at least one of the plurality of transceivers 26 is disposed in the wellbore 12. For example, at least one of the plurality of transceivers 26 can be disposed within the casing 20, e.g., disposed on, e.g., coupled to, the well string 22 to be exposed to an annulus 19 formed between the casing 20 and the well string 22, or can be disposed on the casing 20, e.g., exposed to the annulus 19 or disposed between the casing 20 and a sidewall of the wellbore 12. In one or more embodiments, the plurality of transceivers 26 are used with casing 20 alone, i.e. without well string 22 being disposed in the wellbore 12.

In some instances, the well telemetry system is communicably coupled or otherwise associated with the well tool 24 to encode communications from the well tool 24 and decode communications to the well tool 24. The well tool 24 can include one or more sensors (e.g., pressure sensor, temperature sensor, accelerometer, rotational sensor, etc.) that generate an electrical signal that is received by a controller of a transceiver 26 coupled to the well tool 24, encoded (e.g., via pulse width modulator), and transformed into an acoustic signal. In one or more embodiments, the acoustic signal is ultrasonic, e.g., frequencies greater than audible sound, such as frequencies greater than or equal to 20 kilohertz (kHz). In one or more embodiments, communication to the well tool 24 is received at the transceiver 26, transformed to electrical signal, decoded by the controller of the transceiver 26 (or coupled thereto), and communicated to the well tool 24. Note, however, that, in one or more embodiments, the well tool 24 and the transceiver 26 are one and the same. Additional transceivers (not shown) can be provided for communication with other well tools, sensors and/or other components in the wellbore 12. The well telemetry system is acoustically coupled to the remainder of the well string 22 so that acoustic vibrations produced by the plurality of transceivers 26 go into the well string 22 and acoustic vibrations of the well string 22 are received by the plurality of transceivers 26. Although shown on the well string 22 and well tool 24, the plurality of transceivers 26 of the telemetry system can be additionally or alternatively provided on other components in the well, including the casing 20. The plurality of transceivers 26 can communicate with each other and with the surface telemetry station 28 outside of the wellbore 12. For example, an uppermost well transceiver 26 can be electrically coupled to the surface telemetry station 28 via a wired connection 30 or wireless connection (not shown). The surface telemetry station 28 collects transmission signals from the plurality of transceivers 26 and provides an interface for a user or computer to communicate with the well telemetry system.

Figure 2:
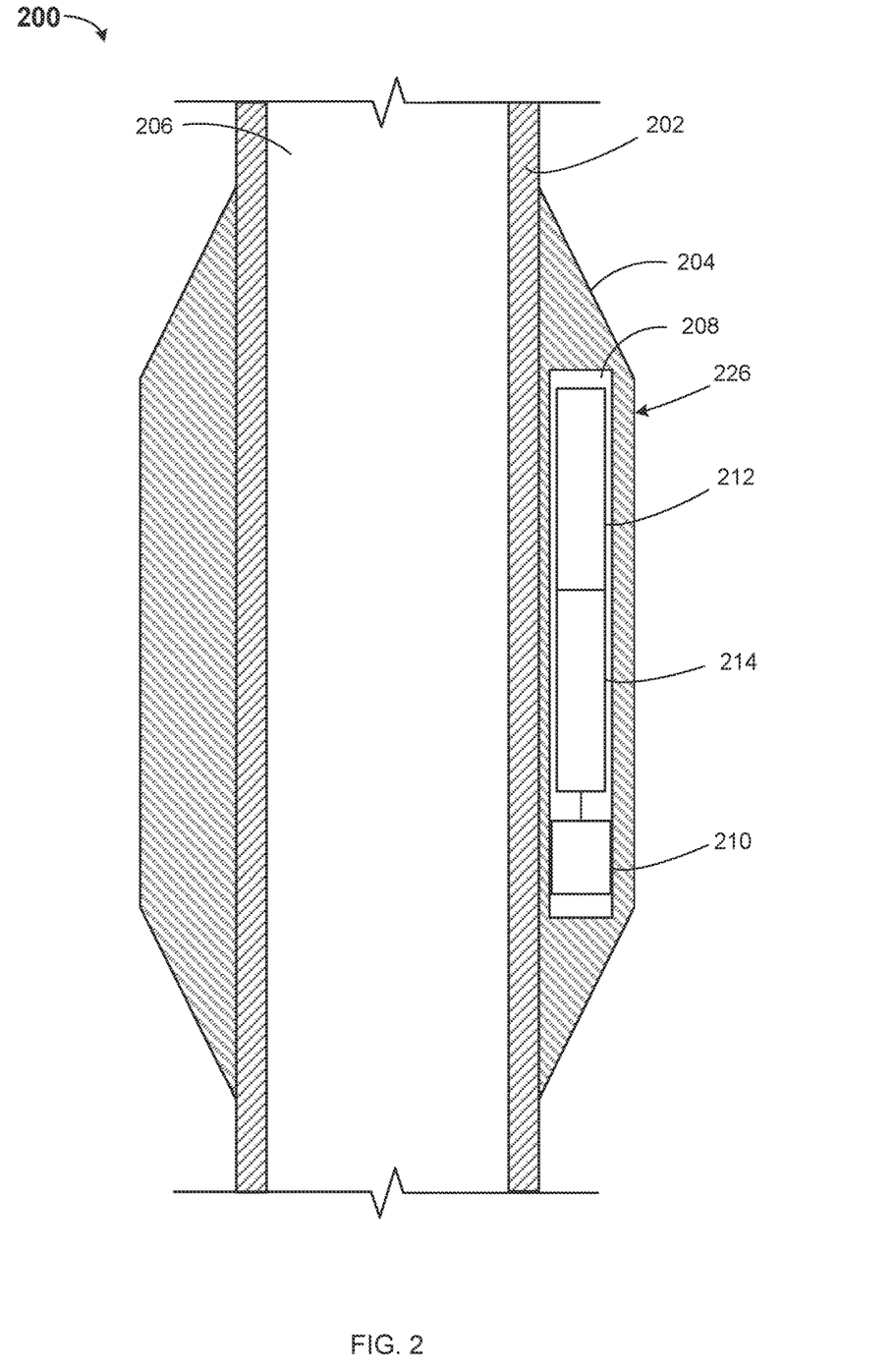
FIG. 2 depicts a schematic partially cross-sectional view of a portion of a tool system having a transceiver coupled to a tubular, according to one or more embodiments.

FIG. 2 depicts a schematic partially cross-sectional view of a portion of a tool system 200 having a transceiver 226 coupled to a tubular 202, according to one or more embodiments. The tool system 200 can be part of the well string 22, the well tool 24, the casing 20, or another downhole tubular. The tool system 200 include a tubular 202 having a flowbore 206. The tubular 202 can be coupled to or part of one or more downhole tubulars, such as the well string 22, the well tool 24, the casing 20, or another downhole tubular. In one or more embodiments, the tubular 202 is coupled to another tubular or part of a tubular that has a second transceiver disposed thereon, with acoustic communication transpiring via the one or more tubulars, e.g., via vibration thereof. The housing 204 can be fixed to the tubular via one or more threads, clamps, slots, or the like.

The transceiver 226 includes a housing 204 having a cavity 208 formed therein. The housing 204 retains a transducer 210, electronics 214, and one or more batteries 212 in the cavity 208. The electronics 214 can include one or more electronic components, e.g., circuits, for receiving, transmitting, encoding, and decoding a signal and for supplying power to the aforementioned electronic components via the one or more batteries 212. For example, the electronics 214 can include a controller and/or a sequencer for controlling the receiving and decoding and/or encoding and transmitting of communication using the transducer 210. As shown, the transceiver 226 is coupled to the tubular 202; however, in some instances the tubular 202 and the housing 204 could be a single piece such that the transceiver is coupled as a sub to other downhole tubulars, e.g., attaching at least one end, axially, to another tubular, e.g., via threads or compression fit, to allow acoustic transmission from the tubular 202 to the coupled tubular. In one or more embodiments, the transceiver 226 is acoustically coupled to the tubular 202.

Figure 3:
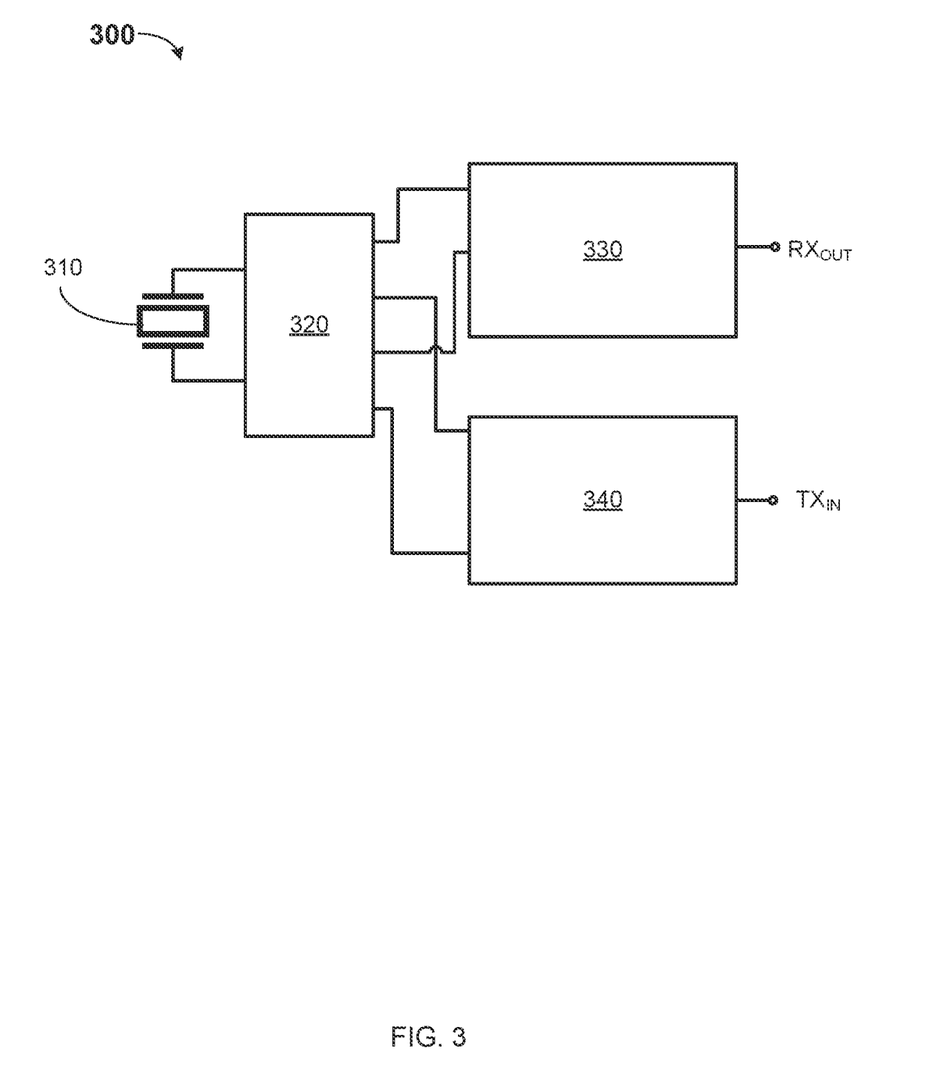
FIG. 3 depicts a schematic of a first transceiver, according to one or more embodiments.

FIG. 3 depicts a schematic of a first transceiver 300, according to one or more embodiments. The first transceiver 300 includes a piezoelectric transducer 310 (i.e. a "crystal"), a switch 320, a receiver 330, and a transmitter 340. The output of the receiver 330 is shown as $RX_{OUT}$, and the input to the transmitter 340 is shown as $TX_{IN}$. $RX_{OUT}$ and $TX_{IN}$ can be connected to other downhole electronics to facilitate retransmission of the signal, actuation of a downhole device (e.g., a downhole tool, downhole sensor, or the like), transmit a downhole sensor output to the surface, or other downhole operations. The switch 320 can be an electromechanical switch (e.g., with one or more relays), a transistor-based switch, an array of switches, a multiplexer, or the like. For example, the switch 320 can include two transistors (e.g., FETs) connected in counter-series. In one or more embodiments, the switch 320 has an "on resistance", i.e. $R_{on}$, ranging from 10 milliohms (m$\Omega$) to 200 ohms ($\Omega$).

The piezoelectric transducer 310 is alternatively coupled, i.e. electrically coupled, to the receiver 330 and the transmitter 340 via the switch 320. Although not depicted in FIG. 3, the first transceiver 300 can be powered by one or more battery (e.g., the one or more batteries 212 in FIG. 2). In one or more embodiments, a first battery powers the receiver 330 and a second battery powers the transmitter 340.

In one or more embodiments, a single piezoelectric transducer 310 is used for both the receiving, via the receiver 330, and for transmitting, via the transmitter 340. In one or more embodiments, the piezoelectric transducer 310 is a multilayer stack of piezo material with as thin layers as possible, i.e. with as many layers as is practical for the total stack height. Piezo material layers are considered "thin" when they are less than 0.5 mm thick. However, it is possible to have thicker layers, e.g., up to 1 mm or thinner layers, e.g., as low as 0.1 mm. In one or more embodiments, the multilayer stack of piezo material can be a laminated stack of piezoceramic wafers that strain in response to electrical signal when transmitting and can convert strain into electrical signal when receiving. In one or more embodiments, the multilayer stack of piezo material can be composed of other electrically responsive material that may or may not be in a laminated stack, such as an electromagnetic driver (e.g., voice coil), a piezoelectric, a piezopolymer, a magnetostrictor, an electrostrictor, a ferroelectric material, or a combination thereof. The stack can have a variety of shapes, adjusted to the space and system requirements.

In one or more embodiments, the thin layers of the piezoelectric transducer 310 give large excursion (measured in pressure) for a small drive voltage. For example, for an applied voltage of 5 V a large excursion would be from about 1 MPa to about 30 MPa. A "small drive voltage" can include voltages less than or equal to 10 V, less than 5 V, or less than 3.3 V. In one or more embodiments, the drive voltage equates to the maximum voltage provided by one or more batteries connected to the transmitter 340. Further, when receiving, the piezoelectric transducer 310, in one or more embodiments, creates a large capacitance to increase the output charge fed to the receiver 330. A large capacitance is considered greater than 1 microfarad ($\mu$F) or greater than 1 millifarad (mF).

In one or more embodiments, the transmitter 340 is configured to provide a large output current. For example, the transmitter 340 can have an output current greater than or equal to 100 milliamps (mA). The switch 320 can be dimensioned to reduce temperature increases due to resistivity and the large current. For example, the switch 320 can include a driver bridge and transistors to reduce temperature increases. In one or more embodiments, the transmitter 340 does not use a step-up transformer.

Figure 4:
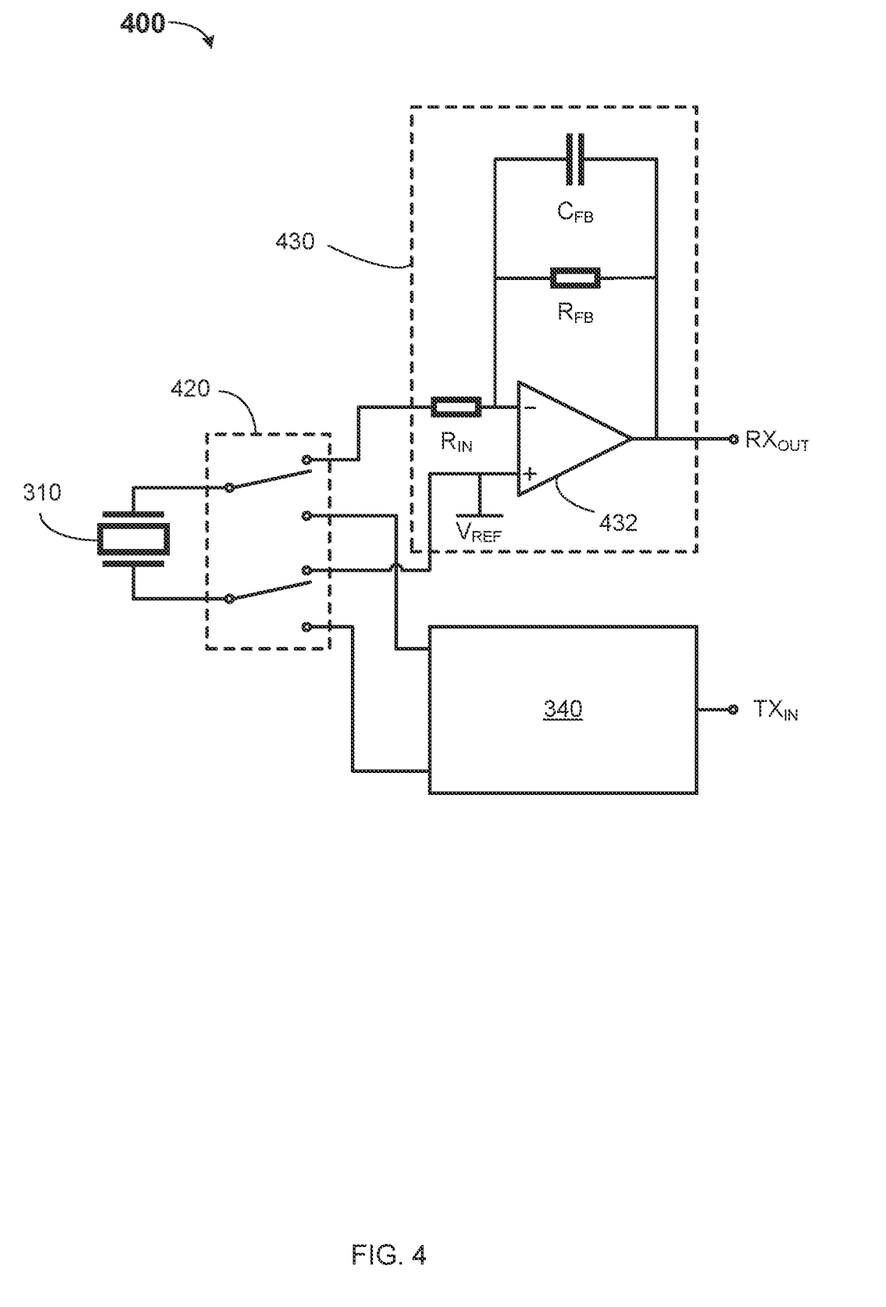
FIG. 4 depicts a schematic of a second transceiver, according to one or more embodiments.

FIG. 4 depicts a schematic of a second transceiver 400, according to one or more embodiments. The second transceiver 400 has a switch 420 and a charge mode receiver 430, i.e. a receiver with a charge mode amplifier (see below).

Although the switch 420 is shown, a multiplexer could also be used with the charge mode receiver 430. The switch 420 allows the piezoelectric transducer 310 to be alternatively connected to the charge mode receiver 430 or the transmitter 340.

The charge mode receiver 430 includes an amplifier 432, a feedback resister $R_{FB}$, and feedback capacitor $C_{FB}$. The resistance into the amplifier 432 is shown as a resistor $R_{IN}$. The amplifier 432 can be tied to a reference voltage $V_{REF}$ (as shown) or to ground, if ground is used. This configuration of the amplifier 432, the feedback resistor $R_{FB}$, and the feedback capacitor $C_{FB}$ places the amplifier in charge mode. A charge mode amplifier is an integrator with very high input impedance. The integration functionality converts charge into voltage, and high input impedance ensures that a small amount of charge generated by the piezoelectric transducer 310 is not lost through leakage. As such, a charge mode amplifier can be used with the piezoelectric transducer 310 to convert an acoustic signal through a tubular into a received signal as a voltage. A voltage output at $RX_{OUT}$ facilitates integration with other electronics, e.g., to a controller to retransmit the signal, such as when the transceiver 400 is in repeater mode, or to actuate one or more downhole tool or sensor. Note, this configuration is shown as an example, i.e. more components (e.g., one or more capacitors and one or more resistors) could be implemented to put the amplifier in to charge mode. Also, there is likely an input capacitance to the receiver and output capacitance to the piezoelectric transducer 310 that are not specifically shown, but that would need to be accounted in a final implementation.

Figure 5:
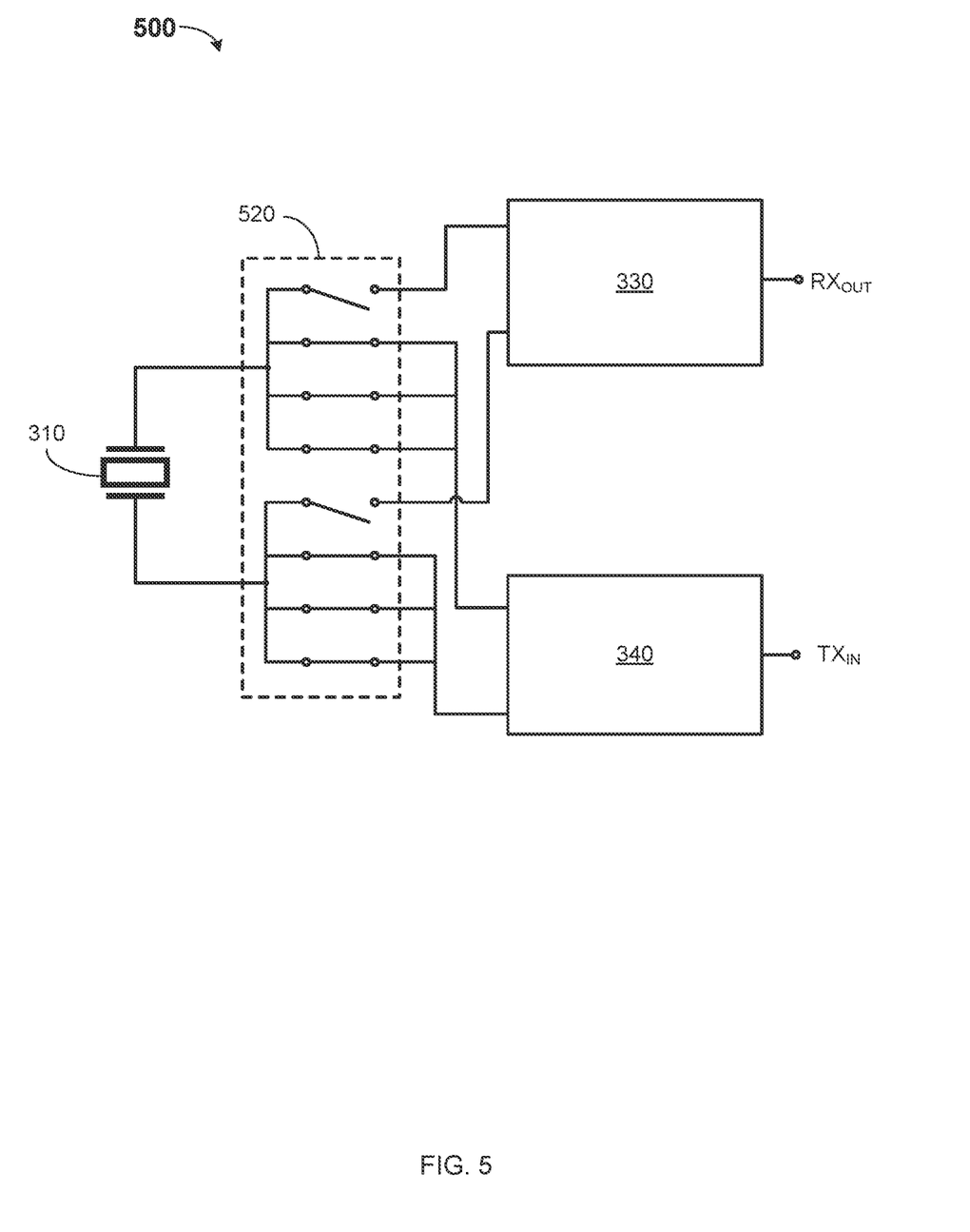
FIG. 5 depicts a schematic of a third transceiver in transmit mode, according to one or more embodiments.

FIG. 5 depicts a schematic of a third transceiver 500 in transmit mode, according to one or more embodiments. The third transceiver 500 depicts a variation of the switch, shown as switch 520 connected to the receiver 330 and the transmitter 340. Note, the receiver 330 in the third transceiver 500 could also be a charge mode receiver, e.g., the receiver 430 depicted in FIG. 4. As shown in FIG. 5, third transceiver 500 is connected in transmit mode. In transmit mode, the transmitter 340 is connected to the piezoelectric transducer 310 via switch elements of the switch 520, i.e., an electrical connection is created between the piezoelectric transducer 310 and the transmitter 340 via the switch 520. Switch 520 has an array of switches, with two switch paths (i.e., channels) for the receiver 330 and six switch paths to the transmitter 340. Note, that a different number of paths could be used without departing from the scope. For example, there could be 4, 6, 8, or 10 number of paths to the receiver 330 and 4, 8, 10, 12, 14, 16, 18, etc. paths to the transmitter 340. In one or more embodiments, there are 2X, 3X, 4X, 5X, 6X, 7X, 8X number of paths to the transmitter 340 where X equals the number of paths to the receiver 330.

The extra paths (i.e., multiple channels) to the transmitter 340 provide a parallel connection between the transmitter 340 and the piezoelectric transducer 310. The parallel connection from the transmitter 340 to the switch 520 lowers the input resistance to the switch 520. Lowering the resistance to the switch 520 can minimize temperature increases in the switch 520.

Figure 6:
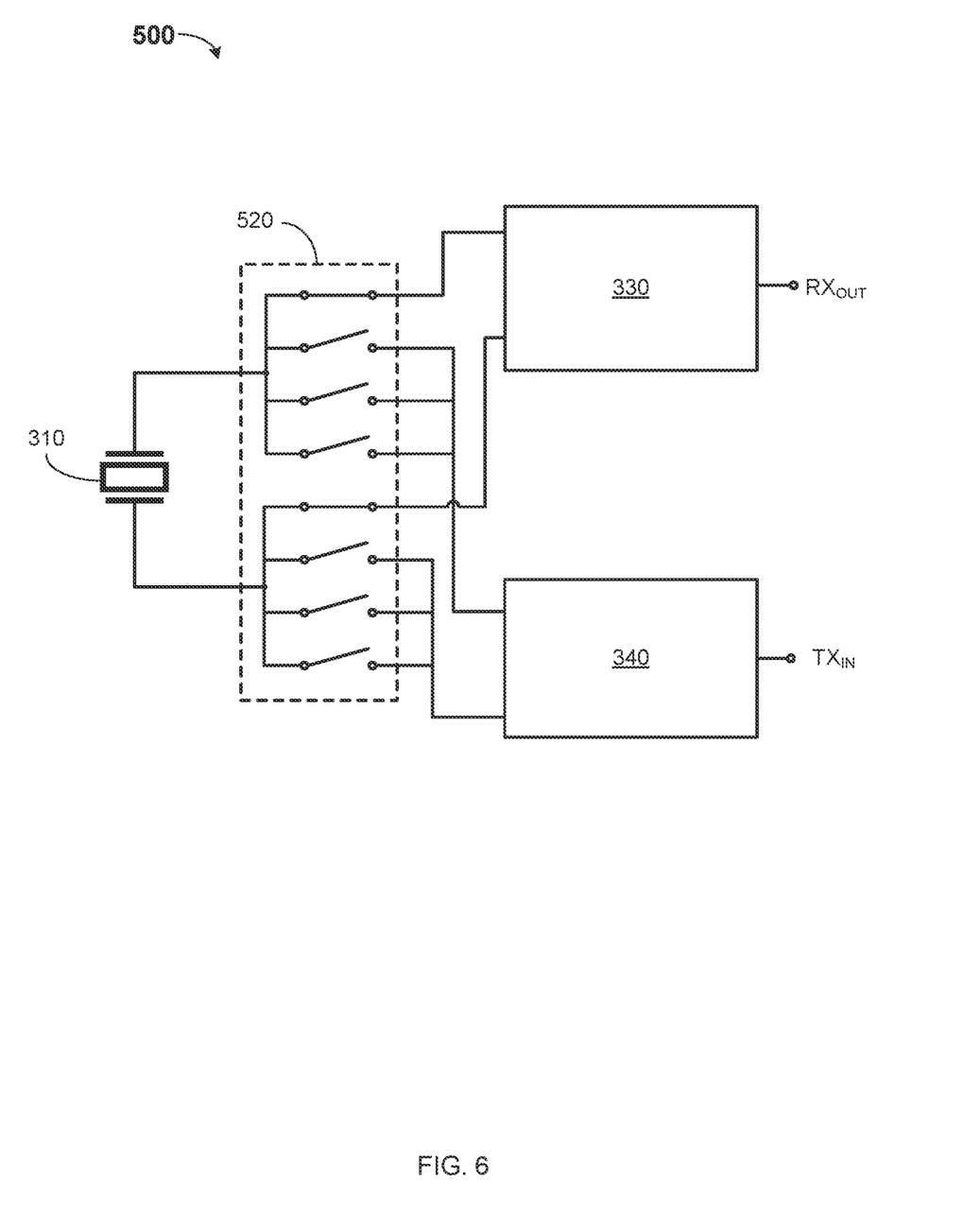
FIG. 6 depicts a schematic of the third transceiver in receive mode, according to one or more embodiments.

FIG. 6 depicts a schematic of the third transceiver 500 in receive mode, according to one or more embodiments. Here, switch 520 is shown with the paths to the transmitter 340 open and the paths to the receiver 330 closed, i.e. an electrical connection is created between the piezoelectric transducer 310 and the receiver 330. By switching in this manner, the same piezoelectric transducer 310 can be used for both the receiver 330 and the transmitter 340, thereby reducing space consumed in the downhole tool and reducing components used, i.e. simplifying the design of the transceiver. The switching via the switch 520 (or any of the other switches described above) can be controlled by a system sequencer (not shown) that is included in the transceiver's electronics (e.g., in electronics 214). In one or more embodiments, the system sequencer switches to the transmitter 340 only when needed for transmission (as the transmitter can have higher power consumption than the receiver) and then switches back to the receiver 330 or disconnects entirely, depending on the intended operational sequence of the transceiver.

Figure 7:
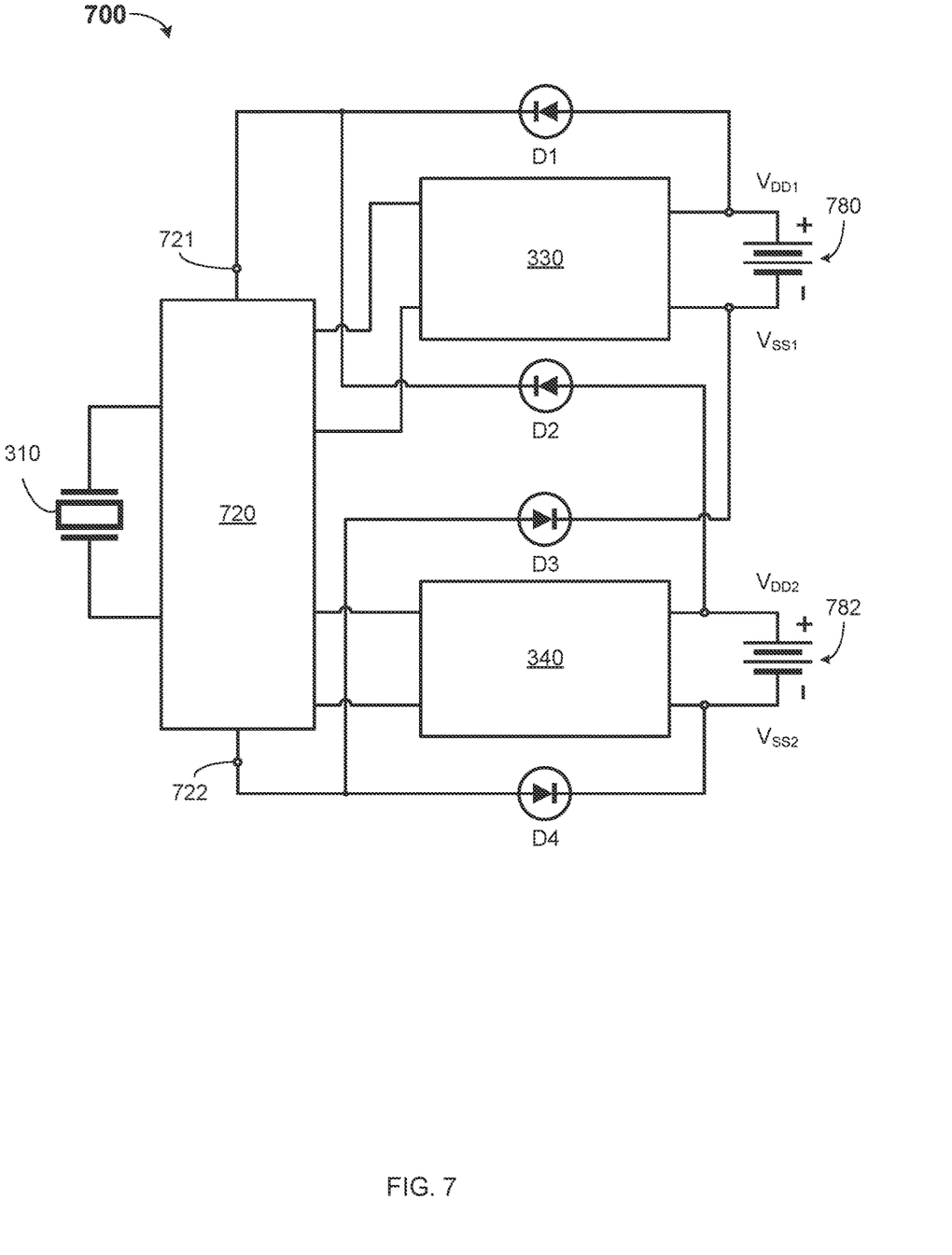
FIG. 7 depicts a schematic of a fourth transceiver, according to one or more embodiments.

FIG. 7 depicts a schematic of a fourth transceiver 700, according to one or more embodiments. The fourth transceiver 700 depicts using a multiplexer 720 instead of a switch, e.g., instead of a transistor-based switch, to connect the piezoelectric transducer 310 to the receiver 330 and the transmitter 340. Note, the receiver 330 in the third transceiver 500 could also be a charge mode receiver, e.g., the receiver 430 depicted in FIG. 4.

A first power source 780 (e.g., one or more batteries, one or more battery packs, or a power supply running off the batteries or battery packs) provides power to the receiver 330. The first power source 780 provides power to the receiver 330 via positive and negative power rails (first positive receiver rail $V_{DD1}$ and first negative receiver rail $V_{SS1}$). In one or more embodiments, the first power source 780 provides between 1 V and 5 V of power to the receiver 330. For example, the first power source 780 can provide 1.25 V, 2.5 V, 3.3 V, or 5 V to the receiver 330.

A second power source 782 (e.g., one or more batteries, one or more battery packs, or a power supply running off the batteries or battery packs) provides power to the transmitter 340. The second power source 782 provides power to the transmitter 340 via positive and negative power rails (second positive transmitter rail $V_{DD2}$ and second negative transmitter rail $V_{SS2}$). In one or more embodiments, the second power source 782 provides between 1 V and 30 V of power to the transmitter 340. For example, the second power source 782 can provide up to 1.25 V, 2.5 V, 3.3 V, or 5 V, 10V, 15 V, 20V, 25 V, or 30 V to the transmitter 340.

With downhole systems, especially in long term completions, system design strives for the lowest possible power usage balanced with strong efficacy of transmission and receiving. As such, the first power source 780 and the second power source 782 may have different voltages. For example, the first power source 780 can supply 2.5 V to 5 V to the receiver 330 and the second power source 782 can supply 5V to 15V to the transmitter 340. As such, in the total voltage to drive the transceiver can range from 7.5 V to 20 V. In one or more embodiments, the total voltage to drive the transceiver is less than 8 V, less than 10 V, less, than 12 V, or less than 15 V. By lowering the voltage, less power is consumed by the transceiver as a whole. Note, although the first power source 780 and the second power source 782 are depicted as coupled to multiplexer 720, the same power sources and voltage levels could be used for the other switches described above (e.g., switch 320, switch 420, or switch 520), i.e., for any of the transceivers described above. In one or more embodiments, the power supplied to the transceiver, e.g., to the receiver 330 and/or the transmitter 340, is steady and regulated.

In one or more embodiments, the multiplexer 720 is powered by the receiver power rails (positive receiver rail $V_{DD1}$ and negative receiver rail $V_{SS1}$), by the transmitter power rails (positive transmitter rail $V_{DD2}$ and negative transmitter rail $V_{SS2}$), or both (i.e., a positive lead 721 of the multiplexer 720 is coupled to the positive receiver rail $V_{DD1}$ and the positive transmitter rail $V_{DD2}$ and a negative lead 722 of the multiplexer 720 is coupled to the negative receiver rail $V_{SS1}$ and the negative transmitter rail $V_{SS2}$). When connecting the multiplexer 720 to both the first power source 780 and the second power source 782, the connections can be isolated by diodes D1, D2, D3, and D4. The first diode D1 isolates the connection between the positive receiver rail $V_{DD1}$ and the multiplexer 720. The second diode D2 isolates the connection between the positive transmitter rail $V_{DD2}$ and the multiplexer 720. The third diode D3 isolates the connection between the negative receiver rail $V_{SS1}$ and the multiplexer 720. The fourth diode D4 isolates the connection between the negative transmitter rail $V_{SS2}$ and the multiplexer 720. In one or more embodiments, the third diode D3 and fourth diode D4 are not required, e.g., when using a single side supply.

In one or more embodiments, either the receiver 330 or the transmitter 340 are only powered as needed. In one or more embodiments, the multiplexer 720 is a beyond-the-rails multiplexer, i.e. a solid-state multiplexer that passes a signal with a voltage higher than the positive rails of the multiplexer and/or lower than the negative rails of the multiplexer without altering the signal or destroying the multiplexer. A beyond-the-rails multiplexer may not require the diodes and thus can reduce diode loss.

In one or more embodiments, the multiplexer 720 has low charge injection, i.e. a charge injection at room temperature ranging from 500 femtocoulombs (fC) to 500 picocoulombs (pC). The charge injection can have an inverse relationship to the resistance $R_{ON}$ through the multiplexer 720. An injected charge can cause a spike in the charge amplifier (e.g., the charge mode amplifier in charge mode receiver 430) after switching and can potentially upset downstream electronics, e.g., downstream filters. Thus, a higher $R_{ON}$ can be useful.

Because of the balance of low charge injection with higher $R_{ON}$ however, there could be unintended heating when using a multiplexer. In one or more embodiments, the multiple channels from the multiplexer 720 are connected in parallel to the transmitter 340 (see e.g., the parallel connections in switch 520), which can help to avoid overheating the multiplexer 720 by lowering resistance, e.g., lowering the resistance to a range of 10 mΩ to 200Ω.

In one or more embodiments, the transceivers (e.g., any of the transceivers described above) can be low power devices. In downhole systems, especially downhole completions, battery power may need to be conserved for months, or even years. In one or more embodiments, the transceivers can be operated without step-up regulation, i.e. they can be run directly with the battery voltage level. This can reduce efficiency loss due to regulation and can lower leakage current, due to lower operating voltages. A low-power design can also reduce the size of the batteries needed. In one or more embodiments, the transceivers are driven at less than or equal to 8 V, less than or equal to 10 V, less than or equal to 15 V, less than or equal to 20 V, less than or equal to 20 V, or less than or equal to 30 V.

Figure 8:
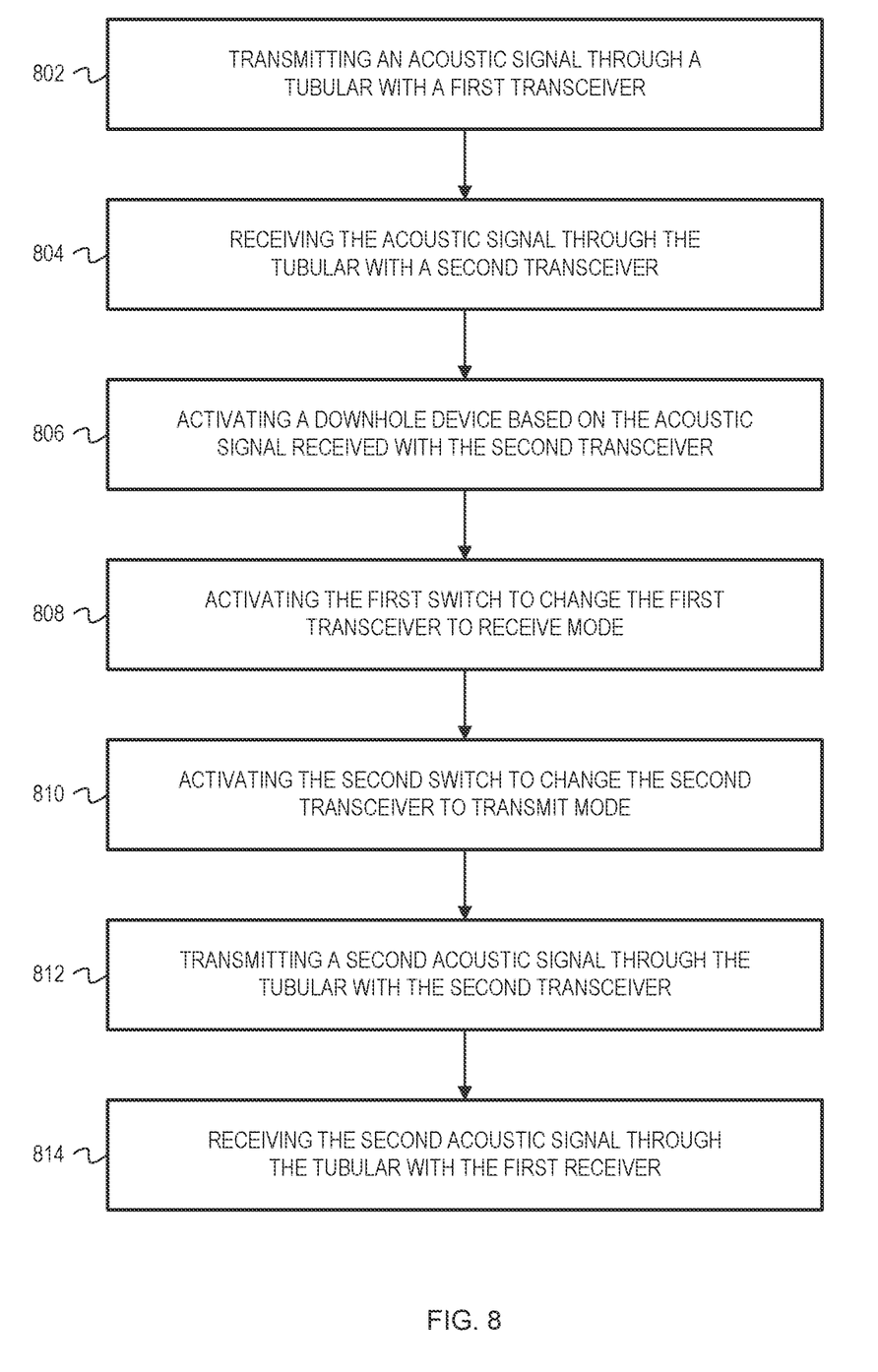
FIG. 8 depicts a flowchart of a method for transmitting a signal along a tubular using a first transceiver and a second transceiver, according to one or more embodiments.

FIG. 8 depicts a flowchart of a method 800 for transmitting a signal along a tubular using a first transceiver and a second transceiver, according to one or more embodiments. The first and second transceivers can be any of one of the transceivers described above. The method 800 can be carried out using the system 100 described in FIG. 1 and the tool system 200 described in FIG. 2.

At 802, an acoustic signal is transmitted through a tubular (e.g., well string 22, casing 20, or another downhole tubular path) with the first transceiver. In one or more embodiments, the first transceiver is located at or near the surface (see, e.g., uppermost transceiver 26 in FIG. 1); however, a first signal transmission could occur from any transceiver, with furthest away from the wellhead or somewhere in between. The first transceiver can include a first piezoelectric transducer acoustically coupled to the tubular, a first switch coupled to the first piezoelectric transducer, a first charge mode receiver coupled to the first switch, and a first transmitter coupled to the first switch. The first transceiver can be in transmit mode, i.e., the first switch can disconnect the first charge mode receiver from the first piezoelectric transducer and/or connect the first transmitter the first piezoelectric transducer. The first transmitter can convert communication from a controller, e.g., via surface telemetry station 28 and the wired connection 30, to the acoustic signal via the first piezoelectric transducer. For example, the first transmitter can apply a current or voltage signal to the first piezoelectric transducer to induce vibration in the first piezoelectric transducer that creates the acoustic signal along the tubular.

At 804, the acoustic signal transmitted through the tubular is received with the second transceiver. In one or more embodiments, the second transceiver is located further downhole than the first transceiver. The second transceiver can include a second piezoelectric transducer coupled to the tubular, a second switch coupled to the second piezoelectric transducer, a second charge mode receiver coupled to the second switch, and a second transmitter coupled to the switch. The second transceiver can be in receive mode, i.e., the second switch can disconnect the second transmitter to the second piezoelectric transducer and/or connect the second charge mode receiver to the second piezoelectric transducer. The acoustic signal can induce vibration and/or displacement in the second piezoelectric transducer that can be received as a charge by the second charge mode receiver and converted into a voltage.

At 806, a downhole device (e.g., a downhole tool, downhole sensor, or the like) can be activated, or actuated, based on the acoustic signal received with the second transceiver. In one or more embodiments, the voltage from the receiver can be transmitted to a controller and the signal can be decoded. Based on the decoded signal, the downhole device is activated or actuated. For example, based on the signal one or more measurement could be a taken with a downhole system, one or more valve can be opened or closed, one or more sleeve or baffle can be actuated, or some other downhole action can be performed.

At 808, the first switch of the first transceiver can change the first transceiver to receive mode. For example, the first switch can be instructed, e.g., via a controller and/or surface computer, to disconnect the first transmitter from the first piezoelectric transducer and/or to connect the first charge mode receiver to the first piezoelectric transducer.

Similarly, at 810, the second switch of the second transceiver can change the second transceiver to transmit mode. For example, the second switch can be instructed to disconnect the second charge mode receiver from the second piezoelectric transducer and/or to connect the second transmitter to the second piezoelectric transducer. For downhole transceivers, downhole electronics can determine when and how a transceiver should switch between receive mode and transmit mode. For example, a timing sequence could be used based on received transmission from the surface to determine when exactly a downhole transceiver switches to transmit mode.

Once the first transceiver is changed to receive mode and the second transceiver is changed to transmit mode, at 812, a second acoustic signal is transmitted through the tubular with the second transducer. Then, at 814, the second acoustic signal is received with the first receiver. The received acoustic signal can be retransmitted, e.g., when the transceiver is being used as a repeater, or can be decoded transmitted to a surface device, e.g., one or more surface computers.

The flowchart in FIG. 8 is annotated with a series of numbered blocks 802 to 814. These numbered blocks represent stages of operations. Although these stages are ordered for this example, the stages illustrate one example to aid in understanding this disclosure and should not be used to limit the claims. Subject matter falling within the scope of the claims can vary with respect to the order and some of the operations.

The flowchart is provided to aid in understanding the illustrations and is not to be used to limit scope of the claims. The flowchart depicts example operations that can vary within the scope of the claims. Additional operations may be performed; fewer operations may be performed; the operations may be performed in parallel; and the operations may be performed in a different order. For example, the operations depicted in blocks 802 to 804 and blocks 812 to 814 can be performed in reverse order. With respect to 806, a activating a downhole device is not always required. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

While the aspects of the disclosure are described with reference to various implementations and exploitations, it will be understood that these aspects are illustrative and that the scope of the claims is not limited to them. In general, techniques for encoding and decoding a signal as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Unless otherwise specified, use of the terms "connect," "engage," "couple," "attach," or any other like term describing an interaction between elements is not meant to limit the interaction to direct interaction between the elements and may also include indirect interaction between the elements described. For example, a transducer may be acoustically coupled to a tubular without being directly adjacent to the tubular, e.g., there could be an intermediate material therebetween such as a tool housing or the like.

Unless otherwise specified, use of the terms "up," "upper," "upward," "up-hole," "upstream," or other like terms shall be construed as generally from the formation toward the surface, e.g., toward wellhead 14 in FIG. 1, or toward the surface of a body of water; likewise, use of "down," "lower," "downward," "downhole," "downstream," or other like terms shall be construed as generally into the formation away from the surface or away from the surface of a body of water, regardless of the wellbore orientation. Use of any one or more of the foregoing terms shall not be construed as denoting positions along a perfectly vertical axis.

Unless otherwise specified, use of the term "subterranean formation" shall be construed as encompassing both areas below exposed earth and areas below earth covered by water such as ocean or fresh water.

As used herein, the term "or" is inclusive unless otherwise explicitly noted. Thus, the phrase "at least one of A, B, or C" is satisfied by any element from the set {A, B, C} or any combination thereof, including multiples of any element.

The invention claimed is:

1. A transceiver comprising:
a single piezoelectric transducer;
a charge mode receiver and a first battery coupled to the charge mode receiver, the first battery configured to provide power to the charge mode receiver;
a transmitter and a second battery coupled to the transmitter, the second battery configured to provide power to the transmitter; and
a switch coupled to the single piezoelectric transducer, the charge mode receiver, and the transmitter; the switch configured to activate the single piezoelectric transducer to cooperate with the charge mode receiver to receive a first acoustic signal and to activate the transmitter to transmit a second acoustic signal, wherein the switch is a multiplexer and wherein the multiplexer is coupled to the first battery via one or more first diodes and is coupled to the second battery.

2. The transceiver of claim 1, wherein the piezoelectric transducer has thin layers.

3. The transceiver of claim 1, wherein the charge mode receiver comprises an amplifier, a feedback capacitor, and a feedback resistor.

4. The transceiver of claim 1, wherein the first battery provides a positive receiver rail and a negative receiver rail,
wherein the second battery provides a positive transmitter rail and a negative transmitter rail,
wherein a positive lead of the multiplexer is coupled to the positive receiver rail and the positive transmitter rail, and
wherein a negative lead of the multiplexer is coupled to the negative receiver rail and the negative transmitter rail.

5. The transceiver of claim 1, wherein the charge mode receiver and the transmitter are powered by less than or equal to 10V.

6. The transceiver of claim 1,
wherein the first battery coupled to the charge mode receiver is configured to provide electrical power at a first voltage; and
wherein the second battery coupled to the transmitter is configured to provide electrical power at a second voltage that is different from the first voltage.

7. The transceiver of claim 1, wherein the multiplexer is coupled to the second battery via one or more second diodes.

8. A method comprising:
activating a first switch connected to a first charge mode receiver and a first transmitter of a first transceiver coupled to a tubular, the first switch configured to activate either the first charge mode receiver or the first transmitter;
transmitting a first acoustic signal through a tubular with the first transceiver upon activation of the first transmitter, the first transceiver including:
a first piezoelectric transducer coupled to the tubular,
a first battery coupled to the first charge mode receiver, the first battery configured to provide power to the charge mode receiver;
a second battery coupled to the first transmitter, the second battery configured to provide power to the first transmitter,
wherein the first switch is further coupled to the first piezoelectric transducer, wherein the first switch is a first multiplexer, and wherein the first multiplexer is coupled to the first battery via one or more first diodes and is coupled to the second battery;
activating a second switch connected to a second charge mode receiver and a second
transmitter of a second transceiver coupled to the tubular, the second switch configured to
activate either the second charge mode receiver or the second transmitter;
receiving the second acoustic signal through the tubular with the second transceiver upon activation of the second charge mode receiver, the second transceiver including:
a second piezoelectric transducer coupled to the tubular,
wherein the second switch is further coupled to the second piezoelectric transducer.

9. The method of claim 8, further comprising:
activating the first switch to change the first transceiver to receive mode; and
activating the second switch to change the second transceiver to transmit mode.

10. The method of claim 9, further comprising:
transmitting a second acoustic signal through the tubular with the second transceiver; and
receiving the second acoustic signal through the tubular with the first transceiver.

11. The method of claim 9,
wherein activating the first switch to change the first transceiver to receive mode comprises creating a first electrical connection between the first piezoelectric transducer and the first charge mode receiver; and
wherein activating the second switch to change the second transceiver to transmit mode comprises creating a second electrical connection between the second piezoelectric transducer and the second transmitter.

12. The method of claim 8, further comprising activating a downhole device based on the acoustic signal received with the second transceiver.

13. The method of claim 8, wherein the second transceiver further comprises:
a third battery coupled to the second charge mode receiver, the third battery configured to provide power to the second charge mode receiver; and
a fourth battery coupled to the second transmitter, the fourth battery configured to provide power to the second transmitter.

14. The method of claim 13, wherein the second multiplexer is coupled to the fourth battery via one or more fourth diodes.

15. A system comprising:
a first transceiver disposed on a tubular, the first transceiver comprising:
a first piezoelectric transducer acoustically coupled to the tubular;
a first charge mode receiver and a first battery coupled to the first charge mode receiver and configured to provide power to the charge mode receiver;
a first transmitter and a second battery coupled to the first transmitter and configured to provide power to the transmitter; and a first switch coupled to the first piezoelectric transducer, the first charge mode receiver, and the first transmitter, the first switch configured to enable the first piezoelectric transducer to activate the first charge mode receiver to receive a first acoustic signal or to activate the first transmitter to transmit a second acoustic signal, wherein the switch is a multiplexer and wherein the multiplexer is coupled to the first battery via one or more first diodes and is coupled to the second battery;

a second transceiver disposed on the tubular, the second transceiver comprising:
    a second piezoelectric transducer acoustically coupled to the tubular;
    a second receiver;
    a second transmitter; and
    a second switch coupled to the second piezoelectric transducer, the second receiver, and the second transmitter, the second switch configured to enable the second piezoelectric transducer to activate the second receiver to receive a third acoustic signal or to activate the second transmitter to transmit a fourth acoustic signal.

16. The system of claim 15, wherin the second receiver is a second charge mode receiver.

17. The method of claim 16, wherein the second switch is a second multiplexer, wherein the second multiplexer is coupled to the third battery via one or more third diodes and is coupled to the fourth battery.

18. The system of claim 15,
wherein the first battery coupled to the first charge mode receiver is configured to provide electrical power at a first voltage; and
wherein the second battery coupled to the first transmitter is configured to provide electrical power at a second voltage that is different from the first voltage.

19. The system of claim 15, further comprising a downhole tool, wherein the downhole tool is coupled to the second transceiver.

* * * * *